United States Patent
Uchida et al.

(10) Patent No.: US 9,284,445 B2
(45) Date of Patent: Mar. 15, 2016

(54) RESIN COMPOSITION FOR NANO CONCAVE-CONVEX STRUCTURE, TRANSPARENT MEMBER FOR MONITOR OF VEHICLE NAVIGATION DEVICE AND TRANSPARENT MEMBER FOR COVER OF VEHICLE METER USING SAME COMPOSITION

(75) Inventors: Masayuki Uchida, Otake (JP); Katsuhiro Kojima, Otake (JP); Shinji Makino, Otake (JP); Yusuke Nakai, Otake (JP); Satoru Ozawa, Otake (JP); Haruo Unno, Atsugi (JP); Isao Yamamoto, Yokohama (JP); Takayuki Fukui, Yokohama (JP)

(73) Assignees: Mitsubishi Motor Co., Ltd., Tokyo (JP); Nissan Motor Co., Ltd., Kanagawa (JP)

( * ) Notice: Subject to any disclaimer, the term of this patent is extended or adjusted under 35 U.S.C. 154(b) by 0 days.

(21) Appl. No.: 14/123,801

(22) PCT Filed: Jun. 22, 2012

(86) PCT No.: PCT/JP2012/066070
§ 371 (c)(1),
(2), (4) Date: Dec. 4, 2013

(87) PCT Pub. No.: WO2012/176906
PCT Pub. Date: Dec. 27, 2012

(65) Prior Publication Data
US 2014/0120313 A1      May 1, 2014

(30) Foreign Application Priority Data
Jun. 24, 2011   (JP) ................. 2011-140359

(51) Int. Cl.
*G02B 1/12*   (2006.01)
*C08L 33/14*  (2006.01)
(Continued)

(52) U.S. Cl.
CPC .............. *C08L 33/14* (2013.01); *C08F 220/28* (2013.01); *C08F 290/062* (2013.01); *G02B 1/04* (2013.01);
(Continued)

(58) Field of Classification Search
CPC ... B44F 7/00; G03F 7/027; Y10T 428/24355; G02B 1/12; G02B 1/118; C08L 33/14; C08F 290/062; C08F 220/28
USPC ................................... 428/141, 156
See application file for complete search history.

(56) References Cited

U.S. PATENT DOCUMENTS

2005/0148676 A1*  7/2005  Doi et al. ............. 520/1
2007/0217008 A1*  9/2007  Wang et al. ........... 359/486
(Continued)

FOREIGN PATENT DOCUMENTS

| CN | 101687954 A | 3/2010 |
| JP | 07-316468 A | 12/1995 |

(Continued)

OTHER PUBLICATIONS

English Machine Translation of JP 11-43493 (1999).*
(Continued)

*Primary Examiner* — Aaron Austin
*Assistant Examiner* — Michael Zhang
(74) *Attorney, Agent, or Firm* — Morgan, Lewis & Bockius LLP

(57) ABSTRACT

The present invention relates to a resin composition for a nano concave-convex structure, including 0.01 to 10 parts by mass of an active energy ray polymerization initiator (D), 0.01 to 3 parts by mass of a release agent (E), and 0.01 to 3 parts by mass of a lubricant (F), relative to 100 parts by mass of a polymerization reactive monomer component containing 50 to 95 parts by mass of a tetrafunctional (meth)acrylate monomer (A), 5 to 35 parts by mass of a difunctional (meth)acrylate monomer (B) in which the total number of repeating units within a polyalkylene glycol structure is from 4 to 25, and not more than 15 parts by mass of a monofunctional (meth) acrylate monomer (C) which is copolymerizable with the monomers (A) and (B), and relates to a transparent member for the monitor of a vehicle navigation device and the cover of a vehicle meter.

10 Claims, 1 Drawing Sheet

(51) Int. Cl.
- *C08F 220/28* (2006.01)
- *G02B 1/04* (2006.01)
- *G02B 1/118* (2015.01)
- *C08F 290/06* (2006.01)
- *G03F 7/027* (2006.01)

(52) U.S. Cl.
CPC *G02B 1/118* (2013.01); *G02B 1/12* (2013.01); *G03F 7/027* (2013.01); *Y10T 428/24355* (2015.01)

(56) References Cited

U.S. PATENT DOCUMENTS

| | | | |
|---|---|---|---|
| 2010/0259821 A1* | 10/2010 | Kaida et al. | 359/486 |
| 2010/0323165 A1* | 12/2010 | Sakuma | G02B 1/118 428/167 |

FOREIGN PATENT DOCUMENTS

| | | | |
|---|---|---|---|
| JP | 11043493 A | * | 2/1999 |
| JP | 2005-352121 A | | 12/2005 |
| JP | 2006-147149 A | | 6/2006 |
| JP | 2009-286953 A | | 12/2009 |
| JP | 2010-000719 A | | 1/2010 |
| JP | 2011-221492 A | | 11/2011 |
| JP | 2011-224957 A | | 11/2011 |
| WO | 2008/096872 A1 | | 8/2008 |

OTHER PUBLICATIONS

International Search Report dated Oct. 9, 2012 for International application No. PCT/JP2012/066070.
Chinese Office Action with translation for related Chinese Application No. 201280028734.X issued Dec. 12, 2014 (There is a translation error in the date on the English translated version).
Japanese Office Action with translation for related Japanese Application No. 2011-140359 issued Jan. 20, 2015.

* cited by examiner

RESIN COMPOSITION FOR NANO CONCAVE-CONVEX STRUCTURE, TRANSPARENT MEMBER FOR MONITOR OF VEHICLE NAVIGATION DEVICE AND TRANSPARENT MEMBER FOR COVER OF VEHICLE METER USING SAME COMPOSITION

TECHNICAL FIELD

The present invention relates to a resin composition for a nano concave-convex structure which is ideal for forming a nano concave-convex structure, and a transparent member for the cover of a vehicle meter and a transparent member for the monitor of a vehicle navigation device formed using the same composition.

Priority is claimed on Japanese Patent Application No. 2011-140359, filed Jun. 24, 2011, the content of which is incorporated herein by reference.

BACKGROUND ART

Loss of visibility caused by the reflection of sunlight or illumination or the like at the interfaces (surfaces) where various displays, lenses, show windows or vehicle components (such as covers for meters or monitors for vehicle navigation devices) or the like contact the air has been an ongoing problem. An example of a known method of reducing this reflection is a method in which multiple layers of films having different refractive indices are laminated, so that the reflected light at the film surface and the reflected light at the interface between the film and the substrate cancel each other out by interference. These films are usually produced by methods such as sputtering, vapor deposition or coating or the like. However, with these types of methods, even if the number of laminated films is increased, there is a limit to the reduction in the reflectance and the wavelength dependency of the reflectance. Further, in order to reduce the number of laminated films from the viewpoint of reducing production costs, materials of lower refractive index are required.

Introducing air into a material by some type of method is effective in lowering the refractive index of the material. One known example of this type of method is a method of forming a nano concave-convex structural body on the surface of the film. A film (anti-reflective film) in which a nano concave-convex structural body is formed on a substrate has a cross-section when cut through the direction of the film surface that varies continuously, with the refractive index gradually increasing from the air down to the substrate, and therefore functions as an effective anti-reflective device. Further, this anti-reflective film exhibits superior optical performance which cannot be reproduced by other methods.

Because anti-reflective films having a nano concave-convex structural body on the surface are used at the interface that contacts the air, they require mainly soiling resistance and scratch resistance. However, nano concave-convex structural bodies tend to exhibit inferior soiling resistance and scratch resistance compared with molded bodies such as hard coatings having a smooth surface formed from the same resin composition.

Examples of the soiling on anti-reflective films are numerous, including oily soiling, fingerprints, wax, dust or dirt, and the soiling resistance for anti-reflective films includes a property that inhibits the adhesion of these types of soiling, and a property that facilitates removal when soiling does adhere to the film.

Examples of known methods of imparting anti-reflective films with soiling resistance include methods in which a highly hydrophilic resin composition is used to hydrophilize the film, so that soiling which adheres to the film is lifted and wiped away by water (for example, see Patent Document 1).

DOCUMENTS OF RELATED ART

Patent Documents

Patent Document 1: International Patent Publication No. 2008/096872 pamphlet

SUMMARY OF THE INVENTION

Problems to be Solved by the Invention

Although a nano concave-convex structural body obtained from a highly hydrophilic resin composition as disclosed in Patent Document 1 exhibits excellent soiling resistance, further improvements are required in various other properties such as the scratch resistance and the weather resistance.

Known methods of generating scratch resistance include methods in which lubricants such as silicone-based compounds are added to the resin composition.

However, when a nano concave-convex structural body obtained from a resin composition containing an added lubricant is subjected to weather resistance testing or the like, the lubricant is prone to bleed-out, and the contact angle tends to increase. As a result, the soiling resistance, and particularly the fingerprint wipeability, tends to deteriorate. The blend amount of the lubricant may be reduced to prevent bleed-out of the lubricant, but if the blend amount of the lubricant is too small, then satisfactory scratch resistance cannot be obtained.

On the other hand, known methods of improving the weather resistance include methods in which an ultraviolet absorber or light stabilizer is added to the resin composition.

However, when a nano concave-convex structural body obtained from a resin composition containing an added ultraviolet absorber or light stabilizer is subjected to weather resistance testing or the like, the ultraviolet absorber or light stabilizer is prone to bleed-out, and the contact angle tends to increase. As a result, the soiling resistance, and particularly the fingerprint wipeability, tends to deteriorate.

In this manner, although resin compositions for forming nano concave-convex structural bodies have previously been proposed, they have not provided completely satisfactory durability such as weather resistance. Further, obtaining a nano concave-convex structural body having good soiling resistance, and particularly fingerprint wipeability, good scratch resistance and low reflectivity, as well as exhibiting excellent weather resistance has not proven an easy task.

The present invention takes the above circumstances into consideration, and has an object of providing a resin composition for a nano concave-convex structure that is capable of forming a nano concave-convex structural body having excellent soiling resistance and scratch resistance, low reflectivity, and excellent weather resistance, as well as providing a transparent member for the cover of a vehicle meter and a transparent member for the monitor of a vehicle navigation device which use the same composition.

Means to Solve the Problems

As a result of intensive investigation, the inventors of the present invention discovered that by using a specific monomer component, selecting a lubricant that combines improved scratch resistance and soiling resistance, and an internal release agent that inhibits the development of water repellency in weather resistance testing and enables the soiling resistance to be maintained, and then blending these components with the specific monomer component in a good balance, a nano concave-convex structural body having excellent soiling resistance, and particularly favorable fingerprint wipeability, excellent scratch resistance, low reflectivity and excellent weather resistance could be formed, and they were therefore able to complete the present invention.

In other words, a resin composition for a nano concave-convex structure according to the present invention includes a polymerization reactive monomer component containing 50 to 95 parts by mass of a tetrafunctional (meth)acrylate monomer (A) having 4 radical polymerizable functional groups per molecule, 5 to 35 parts by mass of a difunctional (meth)acrylate monomer (B) having 2 radical polymerizable functional groups and a polyalkylene glycol structure per molecule, in which the total number of repeating units of the alkylene glycol structure that exist in a single molecule is from 4 to 25, and not more than 15 parts by mass of a monofunctional (meth)acrylate monomer (C) which is copolymerizable with the tetrafunctional (meth)acrylate monomer (A) and the difunctional (meth)acrylate monomer (B), and has one radical polymerizable functional group per molecule, and also includes, per 100 parts by mass of the polymerization reactive monomer component, 0.01 to 10 parts by mass of an active energy ray polymerization initiator (D), 0.01 to 3 parts by mass of a release agent (E), and 0.01 to 3 parts by mass of a lubricant (F).

Further, the resin composition preferably further includes 0.01 to 5 parts by mass of an ultraviolet absorber and/or a light stabilizer (G) per 100 parts by mass of the polymerization reactive monomer component.

Moreover, the tetrafunctional (meth)acrylate monomer (A) is preferably at least one compound selected from the group consisting of pentaerythritol tetra(meth)acrylate, ethoxy modified products of pentaerythritol tetra(meth)acrylate, ditrimethylolpropane tetra(meth)acrylate, ethoxy modified products of ditrimethylolpropane tetra(meth)acrylate, and condensation reaction products of trimethylolethane, acrylic acid and succinic anhydride.

Further, the polyalkylene glycol structure of the difunctional (meth)acrylate monomer (B) is preferably a polyethylene glycol structure.

Moreover, the release agent (E) is preferably at least one polyoxyethylene alkyl phosphate ester compound represented by general formula (I) shown below.

[Chemical Formula 1]

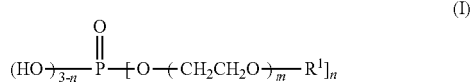

In formula (I), $R^1$ represents an alkyl group, m represents a number of 1 to 20, and n represents a number of 1 to 3.

In addition, the lubricant (F) is preferably a compound having a polyether-modified polydimethylsiloxane skeleton.

Further, a transparent member for the cover of a vehicle meter according to the present invention has a nano concave-convex structural body formed using the aforementioned resin composition for a nano concave-convex structure.

Furthermore, a transparent member for the monitor of a vehicle navigation device according to the present invention has a nano concave-convex structural body formed using the aforementioned resin composition for a nano concave-convex structure.

In other words, the present invention relates to the following aspects.

(1) A resin composition for a nano concave-convex structure, including a polymerization reactive monomer component which, when the total amount of all the monomers within the polymerization reactive monomer component is deemed to be 100 parts by mass, contains 50 to 95 parts by mass of a tetrafunctional (meth)acrylate monomer (A) having 4 radical polymerizable functional groups per molecule, 5 to 35 parts by mass of a difunctional (meth)acrylate monomer (B) having 2 radical polymerizable functional groups and a polyalkylene glycol structure per molecule, in which the total number of repeating units of the alkylene glycol structure that exist in a single molecule is from 4 to 25, and not more than 15 parts by mass of a monofunctional (meth)acrylate monomer (C) which is copolymerizable with the tetrafunctional (meth)acrylate monomer (A) and the difunctional (meth)acrylate monomer (B), and has one radical polymerizable functional group per molecule, and also including, per 100 parts by mass of the polymerization reactive monomer component, 0.01 to 10 parts by mass of an active energy ray polymerization initiator (D), 0.01 to 3 parts by mass of a release agent (E), and 0.01 to 3 parts by mass of a lubricant (F).

(2) The resin composition for a nano concave-convex structure according to (1), further including 0.01 to 5 parts by mass of at least one component (G) selected from the group consisting of ultraviolet absorbers and light stabilizers, per 100 parts by mass of the polymerization reactive monomer component.

(3) The resin composition for a nano concave-convex structure according to (1) or (2), wherein the tetrafunctional (meth)acrylate monomer (A) is at least one compound selected from the group consisting of pentaerythritol tetra(meth)acrylate, ethoxy modified products of pentaerythritol tetra(meth)acrylate, ditrimethylolpropane tetra(meth)acrylate, ethoxy modified products of ditrimethylolpropane tetra(meth)acrylate, and condensation reaction products of trimethylolethane, acrylic acid and succinic anhydride.

(4) The resin composition for a nano concave-convex structure according to any one of (1) to (3), wherein the polyalkylene glycol structure of the difunctional (meth)acrylate monomer (B) is a polyethylene glycol structure.

(5) The resin composition for a nano concave-convex structure according to any one of (1) to (4), wherein the release agent (E) is at least one polyoxyethylene alkyl phosphate ester compound represented by general formula (I) shown below:

[Chemical Formula 2]

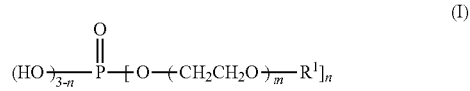

wherein $R^1$ represents an alkyl group, m represents an integer of 1 to 20, and n represents an integer of 1 to 3.

(6) The resin composition for a nano concave-convex structure according to any one of (1) to (5), wherein the lubricant (F) is a compound having a polyether-modified polydimethylsiloxane skeleton.

(7) A transparent member for the cover of a vehicle meter, the transparent member having a nano concave-convex structural body formed using the resin composition for a nano concave-convex structure according to any one of (1) to (6).

(8) A transparent member for the monitor of a vehicle navigation device, the transparent member having a nano concave-convex structural body formed using the resin composition for a nano concave-convex structure according to any one of (1) to (6).

Effects of the Invention

The present invention is able to provide a resin composition for a nano concave-convex structure that is capable of forming a nano concave-convex structural body having excellent soiling resistance and scratch resistance, low reflectivity, and excellent weather resistance, and can also provide a transparent member for the cover of a vehicle meter and a transparent member for the monitor of a vehicle navigation device which use the same composition.

EMBODIMENTS FOR CARRYING OUT THE INVENTION

Figure 1:
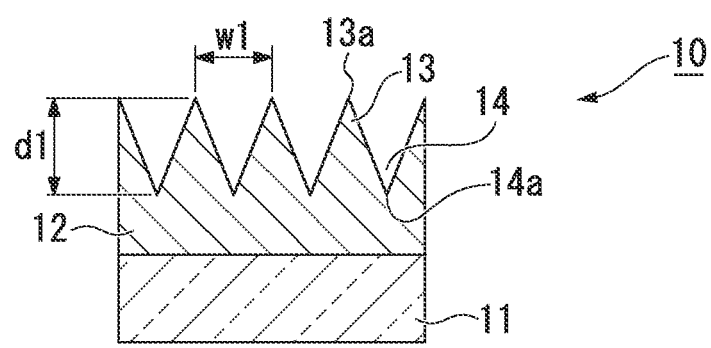
FIG. 1 is a cross-sectional view schematically illustrating one example of a nano structural body formed using a resin composition for a nano concave-convex structure according to the present invention.

The present invention is described below in further detail.

In the present invention, "(meth)acrylate" means "acrylate and/or methacrylate".

Further, an "active energy ray" means energy rays such as an electron beam, ultraviolet rays, visible light rays or infrared rays.

[Resin Composition for Nano Concave-Convex Structure]

The resin composition for a nano concave-convex structure according to the present invention (hereafter also referred to as simply "the resin composition") is a resin composition which undergoes a polymerization reaction and cures upon irradiation with active energy rays.

The resin composition of the present invention contains a polymerization reactive monomer component, an active energy ray polymerization initiator (D), a release agent (E), a lubricant (F) and, where desired, at least one component (G) selected from the group consisting of ultraviolet absorbers and light stabilizers.

Each of these components is described below.

<Polymerization Reactive Monomer Component>

The polymerization reactive monomer component contains a tetrafunctional (meth)acrylate monomer (A), a difunctional (meth)acrylate monomer (B), and a monofunctional (meth)acrylate monomer (C).

(Tetrafunctional (Meth)Acrylate Monomer (A))

The tetrafunctional (meth)acrylate monomer (A) (hereafter also referred to as "the monomer (A)") is the main component of the resin composition, and has the role of favorably maintaining the mechanical properties (and particularly the scratch resistance) of the cured product.

The monomer (A) has 4 radical polymerizable functional groups per molecule. As a result, the molecular weight between crosslinks in the cured product of the resin composition is reduced, the elastic modulus and the hardness of the cured product increase, and a cured product having excellent scratch resistance can be obtained.

As the monomer (A), the use of a hydrocarbon compound having 4 acryloyloxy groups bonded thereto is preferable. This type of compound can be obtained, for example, by reacting 4 (meth)acrylic compounds with a hydrocarbon having 4 hydroxyl groups bonded thereto.

Further, as the component (A), the use of an ethoxy-modified product, in which an ethoxy structure has been introduced between an acryloyloxy group and a hydrocarbon group in a hydrocarbon compound having 4 acryloyloxy groups bonded thereto, is also preferable.

Specific examples of the monomer (A) include pentaerythritol tetra(meth)acrylate, ethoxy modified products of pentaerythritol tetra(meth)acrylate, ditrimethylolpropane tetra(meth)acrylate, ethoxy modified products of ditrimethylolpropane tetra(meth)acrylate, or condensation reaction products of trimethylolethane, acrylic acid and succinic anhydride.

Commercially available products may be used as the monomer (A), and examples of favorable products include NK Ester ATM-4E or NK Ester A-TMMT manufactured by Shin-Nakamura Chemical Co., Ltd TAS manufactured by Osaka Organic Chemical Industry Ltd., or Ebecryl 40 manufactured by Daicel-Cytec Co., Ltd. If these products are used, then a good balance can be achieved more easily between the scratch resistance and the soiling resistance, and particularly the fingerprint wipeability.

A single type of the monomer (A) may be used alone, or a combination of 2 or more types may be used.

When the total amount of all the monomers within the polymerization reactive monomer component is deemed to be 100 parts by mass, the amount of the monomer (A) is from 50 to 95 parts by mass, and from the viewpoint of the water resistance and chemical resistance, is preferably from 60 to 90 parts by mass, and more preferably from 65 to 85 parts by mass. When the amount of the monomer (A) is at least as large as the aforementioned lower limit, the elastic modulus, hardness and scratch resistance of the cured product of the resin composition improve. On the other hand, when the amount of the monomer (A) is not more than the upper limit, the elastic modulus of the cured product can be prevented from becoming too high, and the occurrence of cracking during release from the stamper can be prevented. In addition, the cured product can be prevented from becoming too hard and too brittle, and a nano concave-convex structural body having excellent scratch resistance can be formed.

(Difunctional (Meth)Acrylate Monomer (B))

The difunctional (meth)acrylate monomer (B) (hereafter also referred to as "the monomer (B)") has the role of hydrophilizing the surface of the nano concave-convex structural body, and imparts the nano concave-convex structural body with soiling resistance.

The monomer (B) has 2 radical polymerizable functional groups per molecule. Further, the monomer (B) also has a polyalkylene glycol structure, and the total number of repeating units within the polyalkylene glycol structure that exists in a single molecule of the monomer (B) is from 4 to 25, preferably from 9 to 23, and more preferably from 10 to 20. When the total number of repeating units is at least as large as the aforementioned lower limit, the hydrophilicity and the soiling resistance improve. On the other hand, when the total number of repeating units is not more than the upper limit, the compatibility with the monomer (A) improves.

From the viewpoint of the hydrophilization, the polyalkylene glycol structure is most preferably a polyethylene glycol structure.

A "polyalkylene glycol structure" means a structure having 2 or more repeating units of an alkylene glycol structure.

A "polyethylene glycol structure" means a structure having 2 or more repeating units of an ethylene glycol structure.

As the monomer (B), a di(meth)acrylate having a long-chain polyethylene glycol structure is preferable, and a polyethylene glycol diacrylate is particularly preferred.

As the monomer (B), trideca(ethylene oxide) diacrylate, tetradeca(ethylene oxide) diacrylate, or tricosa(ethylene oxide) diacrylate or the like is preferable.

Commercially available products may be used as the monomer (B), and examples include M240 or M260 from the "Aronix" series manufactured by Toagosei Co., Ltd., and A-400, A-600 or A-1000 from the "NK Ester" series manufactured by Shin-Nakamura Chemical Co., Ltd.

A single type of the monomer (B) may be used alone, or a combination of 2 or more types may be used.

When the total amount of all the monomers within the polymerization reactive monomer component is deemed to be 100 parts by mass, the amount of the monomer (B) is from 5 to 35 parts by mass, preferably from 10 to 30 parts by mass, and more preferably from 15 to 25 parts by mass. When the amount of the monomer (B) is at least as large as the aforementioned lower limit, the surface of the cured product of the resin composition can be hydrophilized satisfactorily, and the soiling resistance improves. On the other hand, when the amount of the monomer (B) is not more than the upper limit, the elastic modulus and the scratch resistance of the surface of the cured product improve.

In addition, the water resistance of the cured product improves, and therefore a nano concave-convex structural body can be formed which exhibits good optical performance even if wiped with a damp cloth.

(Monofunctional (Meth)Acrylate Monomer (C))

The monofunctional (meth)acrylate monomer (C) (hereafter also referred to as "the monomer (C)") has a role of improving the handling properties and the polymerization reactivity of the resin composition, as well as a role of improving the adhesion to the transparent substrate described below.

The monomer (C) has one radical polymerizable functional group per molecule, and is a monofunctional monomer that is copolymerizable with the monomer (A) and the monomer (B).

However, the component which can greatly alter the physical properties of the resin composition of the present invention is the monomer (A) that represents the main component. Because this monomer (A) tends to have a high viscosity, the handling properties of the resin composition may deteriorate in some cases. In such cases, the resin composition may be diluted with a low-viscosity monofunctional monomer or difunctional monomer to improve the handling properties. However, if one radical polymerizable functional group of a difunctional monomer reacts, then the reactivity of the remaining radical polymerizable functional group tends to decrease. Accordingly, in order to improve the polymerization reactivity of the overall resin composition, a monofunctional monomer is more suitable, and therefore when a high-viscosity monomer (A) is used, it is preferably used in combination with the monomer (C).

Further, the resin composition is generally cured on top of a transparent substrate, and used in an integrated form with the transparent substrate. If a monofunctional monomer having a particularly low molecular weight is used as the monomer (C), then the adhesion between the transparent substrate and the cured product of the resin composition tends to be more favorable.

The most appropriate monomer (C) may be selected in accordance with the material of the transparent substrate, but in order to improve the adhesion with the transparent substrate, an alkyl (meth)acrylate or a hydroxyalkyl (meth)acrylate is particularly desirable. Further, viscosity modifiers such as acryloylmorpholine, or acryloyl isocyanate or the like may also be used. Furthermore, when an acrylic-based film is use as the transparent substrate, methyl acrylate, ethyl acrylate or methyl methacrylate is particularly preferable as the monomer (C).

A single type of the monomer (C) may be used alone, or a combination of 2 or more types may be used.

When the total amount of all the monomers within the polymerization reactive monomer component is deemed to be 100 parts by mass, the amount of the monomer (C) is not more than 15 parts by mass, preferably from 5 to 15 parts by mass, and more preferably from 10 to 12 parts by mass.

When the amount of the monomer (C) is not more than the aforementioned upper limit, the curability of the resin composition improves. Further, the amount of residual unreacted monomer (C) following curing can be reduced, and problems such as a lowering of the elastic modulus or a reduction in the scratch resistance of the cured product caused by the unreacted monomer (C) acting as a plasticizer can be prevented.

<Active Energy Ray Polymerization Initiator (D)>

The active energy ray polymerization initiator (D) is a compound which is cleaved and generates radicals that initiate the polymerization reaction upon irradiation with active energy rays.

From the viewpoints of equipment costs and productivity, ultraviolet rays are generally used as the active energy rays.

There are no particular limitations on the active energy ray polymerization initiator (D). Specific examples include benzophenone, 4,4-bis(diethylamino)benzophenone, 2,4,6-trimethylbenzophenone, methyl ortho-benzoylbenzoate, 4-phenylbenzophenone, t-butylanthraquinone, 2-ethylanthraquinone; thioxanthones such as 2,4-diethylthioxanthone, isopropylthioxanthone or 2,4-dichlorothioxanthone; acetophenones such as diethoxyacetophenone, 2-hydroxy-2-methyl-1-phenylpropan-1-one, benzyl dimethyl ketal, 1-hydroxycyclohexyl-phenyl ketone, 2-methyl-2-morpholino(4-thiomethylphenyl)propan-1-one or 2-benzyl-2-dimethylamino-1-(4-morpholinophenyl)-butanone; benzoin ethers such as benzoin methyl ether, benzoin ethyl ether, benzoin isopropyl ether or benzoin isobutyl ether; acylphosphine oxides such as 2,4,6-trimethylbenzoyldiphenylphosphine oxide, bis(2,6-dimethoxybenzoyl)-2,4,4-trimethylpentylphosphine oxide or bis(2,4,6-trimethylbenzoyl)-phenylphosphine oxide; as well as methylbenzoyl formate, 1,7-bisacridinylheptane or 9-phenylacridine.

A single type of the active energy ray polymerization initiator (D) may be used alone, or a combination of 2 or more types may be used. In particular, using a combination of 2 or more types of active energy ray polymerization initiators having different absorption wavelengths is preferable, and combining 1-hydroxy-cyclohexyl-phenyl ketone and 2,4,6-trimethylbenzoyl-diphenylphosphine oxide, or combining 1-hydroxy-cyclohexyl-phenyl ketone and bis(2,4,6-trimethylbenzoyl)-phenylphosphine oxide is more preferable.

Further, if desired, the active energy ray polymerization initiator (D) may be used in combination with a thermal polymerization initiator, including a persulfate such as potassium persulfate or ammonium persulfate, a peroxide such as benzoyl peroxide, or an azo-based initiator.

The amount of the active energy ray polymerization initiator (D), relative to 100 parts by mass of the polymerization reactive monomer component, is within a range from 0.01 to 10 parts by mass, preferably from 0.1 to 5 parts by mass, and more preferably from 0.2 to 3 parts by mass. When the amount of the active energy ray polymerization initiator (D) is at least as large as the aforementioned lower limit, the curability of the resin composition improves, and the mechanical properties (and particularly the scratch resistance) of the cured product improve.

On the other hand, when the amount of the active energy ray polymerization initiator (D) is not more than the aforementioned upper limit, deterioration in the elastic modulus or the scratch resistance of the cured product caused by residues of the active energy ray polymerization initiator (D) within the cured product can be suppressed, and coloration can also be prevented.

<Release Agent (E)>

Examples of the release agent (E) include phosphate ester compounds, and in terms of suppressing any increase in the contact angle, at least one polyoxyethylene alkyl phosphate ester compound represented by general formula (I) shown below (hereafter also referred to as "the compound (I)") is particularly preferable.

[Chemical Formula 3]

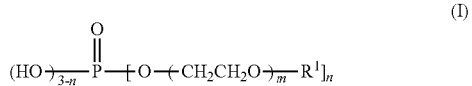

(I)

In formula (I), $R^1$ represents an alkyl group. $R^1$ is preferably an alkyl group having a carbon number of 3 to 18.

Further, in formula (I), m represents the average number of added moles of ethylene oxide, and represents an integer from 1 to 20, and preferably from 1 to 10. On the other hand, n represents an integer of 1 to 3.

The compound (I) may be a monoester, a diester or a triester. Further, in the case of a diester or triester, the respective polyoxyethylene alkyl residues may be different from each other.

When the compound (I) is used as the release agent (E), the releasability of the cured product of the resin composition from the stamper is more favorable, which is ideal for formation of the nano concave-convex structural body. Further, because the load during release is low, a nano concave-convex structural body having minimal defects can be obtained with high productivity. Moreover, the compound (I) has the effect of inhibiting the development of water repellency in weather resistance testing, meaning a resin composition is obtained that can form a nano concave-convex structural body having excellent durability.

Commercially available products may be used as the compound (I), and examples include JP-506H manufactured by Johoku Chemical Co., Ltd., INT-1856 from the "Moldwiz" series manufactured by Axel Plastics Research Laboratories, Inc., and the products TDP-10, TDP-8, TDP-6, TDP-2, DDP-10, DDP-8, DDP-6, DDP-4, DDP-2, TLP-4, TCP-5 or DLP-10 manufactured by Nikko Chemicals Co., Ltd.

One of these compounds may be used alone, or a combination of 2 or more compounds may be used.

The amount of the release agent (E), relative to 100 parts by mass of the polymerization reactive monomer component, is within a range from 0.01 to 3 parts by mass, preferably from 0.05 to 1 part by mass, and more preferably from 0.1 to 0.5 parts by mass. When the amount of the release agent (E) is at least as large as the aforementioned lower limit, adhesion of resin residues to the stamper (release failure) caused by a deterioration in the releasability from the stamper can be prevented, the generation of water repellency (weather resistance failure) can be inhibited, and any deterioration in the initial soiling resistance and the soiling resistance upon weather resistance testing can be prevented. On the other hand, when the amount of the release agent (E) is not more than the aforementioned upper limit, adhesion of resin residues to the stamper (release failure) caused by a deterioration in the adhesion to the transparent substrate described below can be prevented, while maintaining the inherent performance of the cured product of the resin composition. In addition, peeling between the transparent substrate and the cured product during use of the nano concave-convex structural body can be prevented, and the occurrence of mottling or other external appearance faults can be suppressed. Moreover, the weather resistance of the cured product can be maintained favorably.

<Lubricant (F)>

The lubricant (F) has the role of improving the scratch resistance.

The lubricant (F) is preferably a compound having a polyether-modified polydimethylsiloxane skeleton, or may be a reactive compound having acrylic groups or the like. The lubricant (F) may be either a block copolymer or a graft copolymer.

Commercially available products may be used as the lubricant (F), and examples include BYK-378, BYK-333, BYK-331, BYK-377, BYK-3500 or BYK-3510 manufactured by Byk-Chemie Japan K.K.

A single type of the lubricant (F) may be used alone, or a combination of 2 or more types may be used.

The amount of the lubricant (F), relative to 100 parts by mass of the polymerization reactive monomer component, is within a range from 0.01 to 3 parts by mass, preferably from 0.05 to 2 parts by mass, and more preferably from 0.1 to 1.0 parts by mass. When the amount of the lubricant (F) is at least as large as the aforementioned lower limit, any reduction in the scratch resistance of the cured product of the resin composition can be suppressed. On the other hand, when the amount of the lubricant (F) is not more than the aforementioned upper limit, any deterioration in the adhesion between the cured product and the transparent substrate described below can be suppressed, the occurrence of mottling or other external appearance faults is less likely, and the generation of water repellency in weather resistance testing can be prevented.

Poor compatibility between the lubricant (F) and the components other than the lubricant (F) can sometimes cause color irregularities or an increase in the haze of the cured product.

<Ultraviolet Absorber and/or Light Stabilizer (G)>

The resin composition of the present invention preferably includes an ultraviolet absorber and/or a light stabilizer (G) (hereafter these components are also referred to collectively as "the component (G)"). In other words, the component (G) is preferably at least one component selected from the group consisting of ultraviolet absorbers and light stabilizers.

The component (G) has the role of imparting weather resistance, including suppressing yellowing and inhibiting any increase in the haze.

Examples of the ultraviolet absorber include benzophenone-based ultraviolet absorbers, benzotriazole-based ultraviolet absorbers, or benzoate-based ultraviolet absorbers.

Specific examples of the ultraviolet absorber include 2-[4,6-bis(2,4-dimethylphenyl)-s-triazin-2-yl]-5-[3-(dodecyloxy)-2-hydroxypropoxy]phenol or 2-hydroxy-4-methoxybenzophenone.

Examples of commercially available ultraviolet absorbers include the products 400, 479 and 109 from the "Tinuvin" series manufactured by Ciba Specialty Chemicals Inc., or the product 110 from the "Viosorb" series manufactured by Kyodo Chemical Co., Ltd.

On the other hand, examples of the light stabilizer include hindered amine-based light stabilizers.

Specific examples of the light stabilizer include bis(1,2,2,6,6-pentamethyl-4-piperidyl) sebacate or methyl 1,2,2,6,6-pentamethyl-4-piperidyl sebacate.

Examples of commercially available light stabilizers include the products 152 or 292 from the "Tinuvin" series manufactured by Ciba Specialty Chemicals Inc.

A single type of the component (G) may be used alone, or a combination of 2 or more types may be used.

The amount of the component (G), relative to 100 parts by mass of the polymerization reactive monomer component, is within a range from 0.01 to 5 parts by mass, preferably from 0.01 to 3 parts by mass, more preferably from 0.01 to 1 part by mass, and particularly preferably from 0.01 to 0.5 parts by mass. When the amount of the component (G) is at least as large as the aforementioned lower limit, yellowing of the cured product of the resin composition can be suppressed, and any increase in haze can also be inhibited, resulting in an improvement in the weather resistance. On the other hand, when the amount of the component (G) is not more than the aforementioned upper limit, any deterioration in the curability of the resin composition, deterioration in the scratch resistance of the cured product, deterioration in the initial soiling resistance or the soiling resistance upon weather resistance testing, and particularly any deterioration in the fingerprint wipeability, can be effectively prevented.

<Other Additives>

The resin composition of the present invention may also include conventional additives according to need, including plasticizers, antistatic agents, flame retardants, flame retardant assistants, polymerization inhibitors, fillers, silane coupling agents, colorants, reinforcing agents, inorganic fillers, or impact resistance improvers.

<Physical Properties of the Resin Composition>

(Viscosity)

Considering that the resin composition is poured into a stamper to form the nano concave-convex structural body, the viscosity of the resin composition at 25° C., measured using a rotational B-type viscometer, is preferably not more than 10 Pa·s, more preferably not more than 5 Pa·s, and particularly preferably 2 Pa·s or less.

The range for the viscosity at 25° C. measured using a rotational B-type viscometer is preferably from 50 mPa·s to 10 Pa·s, more preferably from 100 mPa·s to 5 Pa·s, and particularly preferably from 200 mPa·s to 2 Pa·s.

Further, when the resin composition is poured into the stamper, the viscosity may be lowered by preheating the resin composition.

The viscosity of the resin composition can be adjusted by altering the types and the amounts of the monomer (A), the monomer (B) and the monomer (C). Specifically, using a large amount of a monomer containing functional groups and chemical structures having intermolecular interactions such as hydrogen bonding tends to increase the viscosity of the resin composition. Further, using a large amount of a low-molecular weight monomer having no intermolecular interactions tends to lower the viscosity of the resin composition.

(Refractive Index)

The resin composition is generally cured on top of a transparent substrate described below, and used in an integrated form with the transparent substrate. However, in those cases where the refractive indices of the cured product and the transparent substrate differ, reflection occurs at the interface between the cured product and the transparent substrate, and the reflectance tends to increase. Accordingly, when the resin composition of the present invention is used in an optical application, the refractive index of the resin composition is preferably adjusted so as to match the refractive index of the transparent substrate being used, thereby reducing the difference in the refractive indices.

The resin composition of the present invention described above contains specific amounts of the polymerization reactive monomer component containing the monomer (A), the monomer (B) and the monomer (C), the active energy ray polymerization initiator (D), the release agent (E), and the lubricant (F), and can therefore form a nano concave-convex structural body having excellent soiling resistance, and particularly fingerprint wipeability, as well as excellent scratch resistance, low reflectivity, and excellent weather resistance.

The resin composition of the present invention can be polymerized and cured, and then used as a molded item, and this type of molded item is extremely useful, particularly as a nano concave-convex structural body having a nano concave-convex structure on the surface.

Further, the resin composition of the present invention is ideal as a resin composition used in transferring a nano concave-convex structure by a transfer method employing a stamper having an inverted structure of the nano concave-convex structure formed thereon.

One example of the nano concave-convex structural body obtained using the present invention is described below in detail.

[Nano Concave-Convex Structural Body]

The nano concave-convex structural body obtained using the present invention is a structural body having a transparent substrate and a cured product layer laminated on top of the transparent substrate, wherein the cured product layer contains a cured product of the resin composition of the present invention, and the cured product layer has a nano concave-convex structure on the surface.

FIG. 1 is a cross-sectional view schematically illustrating one embodiment of the nano concave-convex structural body obtained using the present invention.

The nano concave-convex structural body 10 of this example has a cured product layer 12 formed from a cured product of the resin composition of the present invention laminated on top of a transparent substrate 11 described below. The surface of the cured product layer 12 has a nano concave-convex structure that performs a function such as the prevention of surface reflection. Specifically, convex portions 13 and concave portions 14 are formed at equal intervals on the surface of the cured product layer 12.

In order to realize favorable anti-reflective performance, it is necessary that the spacing between adjacent convex portions 13 or concave portions 14 of the nano concave-convex structure (in FIG. 1, the spacing w1 between the center points (peaks) 13a of adjacent convex portions 13) is of a size not more than the wavelength of visible light. Here, "visible light" indicates light having a wavelength of 380 to 780 nm. Provided this spacing w1 is not more than 380 nm, scattering of visible light can be suppressed.

Further, from the viewpoints of achieving minimal reflectance and suppressing any increase in the reflectance at a specific wavelength, the height of the convex portions 13 or the depth of the concave portions 14 (in FIG. 1, the vertical distance d1 from the center point (bottom) 14a of a concave portion 14 to the center point (peak) 13a of a convex portion 13) is preferably at least 60 nm, and more preferably 90 nm or greater.

In such cases, the nano concave-convex structural body obtained using the present invention can be used favorably for an optical application such as an anti-reflective film. In terms of forming a nano concave-convex structural body that is ideal for optical applications, protrusion structures (convex portions 13) for which the aspect ratio (the value of d1/w1) is 1.2 or greater are capable of producing a superior anti-reflective performance, and are consequently preferred.

Figure 2:
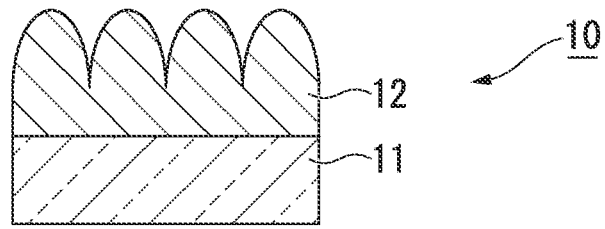
FIG. 2 is a cross-sectional view schematically illustrating another example of a nano structural body formed using a resin composition for a nano concave-convex structure according to the present invention.

There are no particular limitations on the shape of the convex portions of the nano concave-convex structure, and examples include the types of cones or pyramids illustrated in FIG. 1, or the types of bell shapes illustrated in FIG. 2.

Furthermore, the shape of the convex portions of the nano concave-convex structure is not limited to these shapes, and any structure can be used for which the surface area of the cross-section obtained upon cutting through the surface of the cured product layer 12 increases in a continuous manner. Moreover, finer convex portions may combine to form the nano concave-convex structure. In other words, besides the shapes illustrated in FIG. 1 and FIG. 2, any shape for which the refractive index increases continuously from the air down to the material surface, and which exhibits anti-reflective performance that combines low reflectance and low wavelength dependency can be used.

The cured product (nano concave-convex structural body) formed from the resin composition of the present invention exhibits excellent soiling resistance. Further, because a lubricant is used, the cured product also exhibits excellent scratch resistance.

In particular, provided the distance between adjacent convex portions of the nano concave-convex structure is not more than the wavelength of visible light (380 nm), the cured product exhibits excellent anti-reflective performance, and can be used favorably in anti-reflective products. Further, if the height of the convex portions is 60 nm or greater, then the anti-reflective performance is even more superior. The weather resistance is also excellent.

The nano concave-convex structural body obtained using the present invention is not limited to the embodiments illustrated in FIG. 1 or FIG. 2, and the nano concave-convex structure may be formed on one surface of the cured product of the resin composition of the present invention, or on all surfaces of the cured product. Furthermore, the nano concave-convex structure may be formed across the entire cured product, or formed on only a portion of the cured product.

<Production Method>

Examples of the method for producing the nano concave-convex structural body include (1) a method of performing injection molding or press molding using a stamper having an inverted structure of the nano concave-convex structure formed thereon, (2) a method of positioning the resin composition between the stamper and the transparent substrate, curing the resin composition by irradiation with active energy rays to transfer the concave-convex shape of the stamper, and subsequently detaching the stamper, and (3) a method of transferring the concave-convex shape of the stamper to the resin composition, detaching the stamper, and subsequently performing irradiation with active energy rays to cure the resin composition.

Among these methods, in terms of the transferability of the nano concave-convex structure, and the degree of freedom associated with the surface composition, the method (2) is particularly preferable. The method (2) is particularly suitable when a belt-like or roll-like stamper that enables continuous production is used, and is a method that provides excellent productivity.

(Transparent Substrate)

There are no particular limitations on the transparent substrate, provided it is a molded body that transmits light. Examples of the material for forming the transparent substrate include synthetic polymers such as methyl methacrylate (co)polymers, polycarbonates, styrene (co)polymers, or methyl methacrylate-styrene copolymers, semi-synthetic polymers such as cellulose diacetate, cellulose triacetate or cellulose acetate butyrate, polyesters such as polyethylene terephthalate, as well as polyamide, polyimide, polyethersulfone, polysulfone, polyethylene, polypropylene, polymethylpentene, polyvinyl chloride, polyvinyl acetal, polyetherketone, polyurethane or glass.

There are no particular limitations on the shape of, or the production method for, the transparent substrate. For example, an injection molded body, extrusion molded body or cast molded body can be used. The shape may be either a sheet-like shape or a film-like shape. Moreover, for the purpose of improving properties such as the adhesiveness, antistatic properties, scratch resistance or weather resistance, the surface of the transparent substrate may be coated or subjected to a corona treatment.

(Stamper)

There are no particular limitations on the method used for forming the nano concave-convex structure on the stamper. Specific examples of the method include electron beam lithography methods or laser interference methods. In one example, a suitable photoresist film is applied to a suitable support substrate, the photoresist film is exposed with light such as an ultraviolet laser, an electron beam or X-rays, and the film is then developed to obtain a mold having a nano concave-convex structure. This mold can be used without further modification as the stamper, but the support substrate may also be subjected to selective etching by dry etching through the photoresist layer, and the photoresist layer then removed so that a nano concave-convex structure is formed directly on the support substrate.

Further, anodized porous alumina can also be used as the stamper. For example, a porous structure having a spacing of 20 to 200 nm, formed by anodic oxidation of aluminum at a prescribed voltage using oxalic acid, sulfuric acid or phosphoric acid or the like as an electrolyte, may also be used as the stamper. According to this method, by subjecting a high-purity aluminum to anodic oxidation for a long period at a constant voltage, subsequently removing the formed oxide film, and then performing a second anodic oxidation, pores of extremely high regularity can be formed by self-assembly. Moreover, in the second anodic oxidation step, by combining the anodic oxidation treatment with a pore diameter expansion treatment, a nano concave-convex structure can be formed in which the cross-sectional shape is triangular or bell-shaped rather than rectangular.

In addition, a duplicate mold may be prepared from the original mold having the nano concave-convex structure by electroforming or the like, and this duplicate mold then used as the stamper.

There are no particular limitations on the shape of the stamper itself, and for example, a flat plate-shaped stamper, a belt-like stamper or a roll-like stamper may be used. In particular, by using a belt-like or roll-like stamper, the nano concave-convex structure can be transferred continuously, meaning the productivity can be further enhanced.

(Polymerization and Curing Conditions)

In the polymerization and curing method using active energy ray irradiation, polymerization and curing by irradiation with ultraviolet rays is preferable. Examples of lamps for irradiating the ultraviolet rays include a high-pressure mercury lamp, a metal halide lamp, or a fusion lamp.

The irradiation dose of ultraviolet rays may be determined in accordance with the absorption wavelength and the amount of the polymerization initiator in the resin composition. Typically, the cumulative dose is preferably within a range from 100 to 6,000 $mJ/cm^2$, and more preferably from 400 to 4,000 $mJ/cm^2$. When the cumulative dose is at least as large as the aforementioned lower limit, the resin composition can be cured satisfactorily, and deterioration in the scratch resistance due to insufficient curing can be prevented. On the other hand, when the cumulative dose is not more than the upper limit, coloring of the cured product and degradation of the transparent substrate can be prevented.

There are also no particular limitations on the irradiation intensity, but the intensity is preferably suppressed to an output level that does not cause degradation of the transparent substrate.

The nano concave-convex structural body obtained by performing polymerization and curing in this manner has a nano concave-convex structure on the surface that has been transferred from the nano concave-convex structure of the stamper in a key and keyhole type relationship.

The nano concave-convex structural body formed from the cured product of the resin composition of the present invention combines favorable soiling resistance with a high level of scratch resistance, exhibits excellent anti-reflective performance due to the continuous change in the refractive index, and also exhibits excellent weather resistance. Accordingly, a nano concave-convex structural body obtained using the present invention is particularly appropriate as an anti-reflective membrane (including anti-reflective films), or as an anti-reflective component such as an anti-reflective body having a three-dimensional shape.

When the nano concave-convex structural body is used as an anti-reflective film, the nano concave-convex structural body is used by affixing the body to an image display device such as a liquid crystal display device, plasma display panel, electroluminescent display or cathode ray tube display device, or to a target item such as a lens, show window, vehicle meter cover, vehicle navigation device monitor, touch panel, head-up display, mirror display, audio display, display within a meter, or a spectacle lens.

When the portion to which the nano concave-convex structural body is affixed is a three-dimensional shape, the nano concave-convex structural body may be produced using a transparent substrate that has been formed in advance with a shape that matches the three-dimensional shape, and the nano concave-convex structural body then affixed to the prescribed portion of the target item.

Further, when the target item is an image display device, regardless of the surface, the nano concave-convex structural body may be affixed to the front surface of the display device, or the front surface itself may be formed from the nano concave-convex structural body.

Further, besides the applications mentioned above, the nano concave-convex structural body can also be used in other optical applications such as optical waveguides, relief holograms, solar cells, lenses, polarized light separating elements or members for improving the organic electroluminescent light extraction efficiency, and also in other applications such as cell cultivation sheets.

[Transparent Member for Cover of Vehicle Meter, Transparent Member for Monitor of Vehicle Navigation Device]

The transparent member for the cover of a vehicle meter and the transparent member for the monitor of a vehicle navigation device according to the present invention have a nano concave-convex structural body formed using the resin composition of the present invention. These transparent members exhibit excellent anti-reflective performance, and therefore provide superior visibility. Further, they combine favorable soiling resistance and high scratch resistance, and also exhibit excellent weather resistance.

Another aspect of the present invention relates to a resin composition for a nano concave-convex structure including a polymerization reactive monomer component which, when the total amount of all the monomers within the polymerization reactive monomer component is deemed to be 100 parts by mass, contains 50 to 95 parts by mass of the tetrafunctional (meth)acrylate monomer (A) having 4 radical polymerizable functional groups per molecule, 5 to 35 parts by mass of the difunctional (meth)acrylate monomer (B) having 2 radical polymerizable functional groups and a polyalkylene glycol structure per molecule, in which the total number of repeating units of the alkylene glycol structure that exist in a single molecule is from 4 to 25, and 5 to 15 parts by mass of the monofunctional (meth)acrylate monomer (C) which is copolymerizable with the tetrafunctional (meth)acrylate monomer (A) and the difunctional (meth)acrylate monomer (B), and has one radical polymerizable functional group per molecule, and also including, per 100 parts by mass of the polymerization reactive monomer component, 0.01 to 10 parts by mass of the active energy ray polymerization initiator (D), 0.01 to 3 parts by mass of the release agent (E), and 0.01 to 3 parts by mass of the lubricant (F), wherein the tetrafunctional (meth)acrylate monomer (A) is at least one compound selected from the group consisting of pentaerythritol tetra(meth)acrylate, ethoxy modified products of pentaerythritol tetra(meth)acrylate, ditrimethylolpropane tetra(meth)acrylate, ethoxy modified products of ditrimethylolpropane tetra(meth)acrylate, and condensation reaction products of trimethylolethane, acrylic acid and succinic anhydride, the difunctional (meth)acrylate monomer (B) is a polyethylene glycol diacrylate, the monofunctional (meth)acrylate monomer (C) is at least one compound selected from the group consisting of alkyl (meth)acrylates, hydroxyalkyl (meth)acrylates, acryloylmorpholine, acryloyl isocyanate, methyl acrylate, ethyl acrylate and methyl methacrylate, the active energy ray polymerization initiator (D) is at least one compound selected from the group consisting of benzophenone, 4,4-bis(diethylamino)benzophenone, 2,4,6-trimethylbenzophenone, methyl ortho-benzoylbenzoate, 4-phenylbenzophenone, t-butylanthraquinone, 2-ethylanthraquinone, 2,4-diethylthioxanthone, isopropylthioxanthone, 2,4-dichlorothioxanthone, diethoxy-acetophenone, 2-hydroxy-2-methyl-1-phenylpropan-1-one, benzyl dimethyl ketal, 1-hydroxycyclohexyl-phenyl ketone, 2-methyl-2-morpholino(4-thiomethylphenyl)propan-1-one, 2-benzyl-2-dimethylamino-1-(4-morpholinophenyl)-butanone, benzoin methyl ether, benzoin ethyl ether, benzoin isopropyl ether, benzoin isobutyl ether, 2,4,6-trimethylbenzoyldiphenylphosphine oxide, bis(2,6-dimethoxybenzoyl)-2,4,4-trimethylpentylphosphine oxide, bis(2,4,6-trimethylbenzoyl)-phenylphosphine oxide, methylbenzoyl formate, 1,7-bisacridinylheptane and 9-phenylacridine, the release agent (E) is at least one polyoxyethylene alkyl phosphate ester compound represented by general formula (I) shown below, and the lubricant (F) is a compound having a polyether-modified polydimethylsiloxane skeleton.

[Chemical Formula 4]

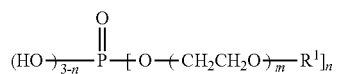
(I)

In formula (I), $R^1$, m and n have the same meanings as defined above.

Yet another aspect of the present invention relates to a resin composition for a nano concave-convex structure including a polymerization reactive monomer component which, when the total amount of all the monomers within the polymerization reactive monomer component is deemed to be 100 parts by mass, contains 50 to 95 parts by mass of the tetrafunctional (meth)acrylate monomer (A) having 4 radical polymerizable functional groups per molecule, 5 to 35 parts by mass of the difunctional (meth)acrylate monomer (B) having 2 radical polymerizable functional groups and a polyalkylene glycol structure per molecule, in which the total number of repeating units of the alkylene glycol structure that exist in a single molecule is from 4 to 25, and 5 to 15 parts by mass of the monofunctional (meth)acrylate monomer (C) which is copolymerizable with the tetrafunctional (meth)acrylate monomer (A) and the difunctional (meth)acrylate monomer (B), and has one radical polymerizable functional group per molecule, also including, per 100 parts by mass of the polymerization reactive monomer component, 0.01 to 10 parts by mass of the active energy ray polymerization initiator (D), 0.01 to 3 parts by mass of the release agent (E) and 0.01 to 3 parts by mass of the lubricant (F), and also including, per 100 parts by mass of the polymerization reactive monomer component, 0.01 to 5 parts by mass of the ultraviolet absorber and/or a light stabilizer (G), wherein the tetrafunctional (meth)acrylate monomer (A) is at least one compound selected from the group consisting of pentaerythritol tetra(meth)acrylate, ethoxy modified products of pentaerythritol tetra(meth)acrylate, ditrimethylolpropane tetra(meth)acrylate, ethoxy modified products of ditrimethylolpropane tetra(meth)acrylate, and condensation reaction products of trimethylolethane, acrylic acid and succinic anhydride, the difunctional (meth)acrylate monomer (B) is a polyethylene glycol diacrylate, the monofunctional (meth)acrylate monomer (C) is at least one compound selected from the group consisting of alkyl (meth)acrylates, hydroxyalkyl (meth)acrylates, acryloylmorpholine, acryloyl isocyanate, methyl acrylate, ethyl acrylate and methyl methacrylate, the active energy ray polymerization initiator (D) is at least one compound selected from the group consisting of benzophenone, 4,4-bis(diethylamino)benzophenone, 2,4,6-trimethylbenzophenone, methyl ortho-benzoylbenzoate, 4-phenylbenzophenone, t-butylanthraquinone, 2-ethylanthraquinone, 2,4-diethylthioxanthone, isopropylthioxanthone, 2,4-dichlorothioxanthone, diethoxyacetophenone, 2-hydroxy-2-methyl-1-phenylpropan-1-one, benzyl dimethyl ketal, 1-hydroxycyclohexyl-phenyl ketone, 2-methyl-2-morpholino(4-thiomethylphenyl)propan-1-one, 2-benzyl-2-dimethylamino-1-(4-morpholinophenyl)-butanone, benzoin methyl ether, benzoin ethyl ether, benzoin isopropyl ether, benzoin isobutyl ether, 2,4,6-trimethylbenzoyldiphenylphosphine oxide, bis(2,6-dimethoxybenzoyl)-2,4,4-trimethylpentylphosphine oxide, bis(2,4,6-trimethylbenzoyl)-phenylphosphine oxide, methylbenzoyl formate, 1,7-bisacridinylheptane and 9-phenylacridine, the release agent (E) is at least one polyoxyethylene alkyl phosphate ester compound represented by general formula (I) shown below, the lubricant (F) is a compound having a polyether-modified polydimethylsiloxane skeleton, the ultraviolet absorber (G) is at least one ultraviolet absorber selected from the group consisting of benzophenone-based ultraviolet absorbers, benzotriazole-based ultraviolet absorbers and benzoate-based ultraviolet absorbers, and the light stabilizer (G) is a hindered amine-based light stabilizer.

[Chemical Formula 5]

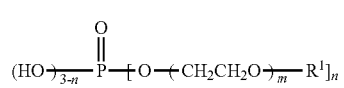
(I)

In formula (I), $R^1$, m and n have the same meanings as defined above.

Yet another aspect of the present invention relates to a resin composition for a nano concave-convex structure including a polymerization reactive monomer component which, when the total amount of all the monomers within the polymerization reactive monomer component is deemed to be 100 parts by mass, contains 50 to 95 parts by mass of the tetrafunctional (meth)acrylate monomer (A) having 4 radical polymerizable functional groups per molecule, 5 to 35 parts by mass of the difunctional (meth)acrylate monomer (B) having 2 radical polymerizable functional groups and a polyalkylene glycol structure per molecule, in which the total number of repeating units of the alkylene glycol structure that exist in a single molecule is from 4 to 25, and 5 to 15 parts by mass of the monofunctional (meth)acrylate monomer (C) which is copolymerizable with the tetrafunctional (meth)acrylate monomer (A) and the difunctional (meth)acrylate monomer (B), and has one radical polymerizable functional group per molecule, also including, per 100 parts by mass of the polymerization reactive monomer component, 0.01 to 10 parts by mass of the active energy ray polymerization initiator (D), 0.01 to 3 parts by mass of the release agent (E) and 0.01 to 3 parts by mass of the lubricant (F), and also including, per 100 parts by mass of the polymerization reactive monomer component, 0.01 to 5 parts by mass of the ultraviolet absorber and/or a light stabilizer (G), wherein the tetrafunctional (meth)acrylate monomer (A) is at least one compound selected from the group consisting of pentaerythritol tetraacrylate, condensation reaction products of trimethylolethane, acrylic acid and succinic anhydride, and ethoxylated pentaerythritol tetraacrylate, the difunctional (meth)acrylate monomer (B) is a polyethylene glycol diacrylate, the monofunctional (meth)acrylate monomer (C) is at least one compound selected from the group consisting of hydroxyethyl acrylate, methyl methacrylate and methyl acrylate, the active energy ray polymerization initiator (D) is at least one compound selected from the group consisting of 1-hydroxy-cyclohexyl-phenyl ketone, bis(2,4,6-trimethylbenzoyl)-phenylphosphine oxide and 2,4,6-trimethylbenzoyl-diphenylphosphine oxide, the release agent (E) is at least one polyoxyethylene alkyl phosphate ester compound represented by general formula (I) shown below, and the light stabilizer (G) is a hindered amine-based light stabilizer.

[Chemical Formula 6]

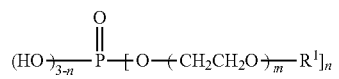

In formula (I), $R^1$, m and n have the same meanings as defined above.

EXAMPLES

The present invention is described below in further detail using a series of examples, but the present invention is in no way limited by these examples.

The stamper was produced in the manner described below.
[Production of Stamper]

An aluminum plate of 99.99% purity was subjected to fabric polishing and electrolytic polishing in a mixed solution of perchloric acid and ethanol (¼ volumetric ratio) to generate a mirror surface.

Step (a):

This aluminum plate was subjected to anodic oxidation for 30 minutes in a 0.3 M aqueous solution of oxalic acid, under conditions including a DC voltage of 40 V and a temperature of 16° C.

Step (b):

The aluminum plate with the oxide film formed thereon was dipped in a mixed aqueous solution containing 6% by mass of phosphoric acid and 1.8% by mass of chromic acid for 6 hours, thereby removing the oxide film.

Step (c):

This aluminum plate was subjected to anodic oxidation for 30 seconds in a 0.3 M aqueous solution of oxalic acid, under conditions including a DC voltage of 40 V and a temperature of 16° C.

Step (d):

The aluminum plate with the oxide film formed thereon was dipped in a 5% by mass aqueous solution of phosphoric acid at 32° C. for 8 minutes, thus performing a pore diameter expansion treatment.

Step (e):

The aforementioned step (c) and step (d) were repeated a total of 5 times, thus obtaining an anodized porous alumina having substantially cone-shaped pores having a depth of 180 nm with a period of 100 nm.

The thus obtained anodized porous alumina was washed with deionized water, and following removal of surface water by air blowing, the alumina was dipped for 10 minutes in a surface anti-soiling coating agent (a solution obtained by diluting "OPTOOL DSX" manufactured by Daikin Industries, Ltd. with a diluent ("HD-ZV" manufactured by Harves Co., Ltd.) to achieve a solid fraction concentration of 0.1% by mass), and was then air dried for 20 hours to obtain a stamper.

Measurement of the pores of the thus obtained stamper using the method described below revealed that a nano concave-convex structure composed of substantially conically shaped tapered concave portions (pores) having a pore depth of 180 nm and a spacing between adjacent pores of 100 nm had been formed on the stamper surface.

Measurement of Stamper Pores:

A partial longitudinal cross-section of the stamper formed from the anodized porous alumina was subjected to Pt vapor deposition (platinum vapor deposition) for one minute, and was then inspected using a field emission-type scanning electron microscope (JSM-7400F manufactured by JEOL Ltd.) at an accelerating voltage of 3.00 kV, and the spacing (period) between adjacent pores and the pore depth were measured. Specifically, each measurement was made at 10 points, and the respective average values were recorded as the measured values.

Example 1

Preparation of Resin Composition

A resin composition was prepared by mixing 80 parts by mass of an ethoxylated pentaerythritol tetraacrylate (NK Ester ATM-4E manufactured by Shin-Nakamura Chemical Co., Ltd.) as the monomer (A), 20 parts by mass of a polyethylene glycol diacrylate (NK Ester A-600 manufactured by Shin-Nakamura Chemical Co., Ltd.) as the monomer (B), 0.5 parts by mass of 1-hydroxy-cyclohexyl-phenyl ketone (Irgacure 184 manufactured by Ciba Specialty Chemicals Inc.) and 0.5 parts by mass of 2,4,6-trimethylbenzoyl-diphenylphosphine oxide (Darocur TPO manufactured by Ciba Specialty Chemicals Inc.) as the active energy ray polymerization initiator (D), 0.1 parts by mass of a polyoxyethylene alkyl phosphate ester compound (Nikkol TLP-4 manufactured by Nikko Chemicals Co., Ltd.) as the release agent (E), 0.5 parts by mass of a polyether-modified polydimethylsiloxane (BYK-378 manufactured by Byk-Chemie Japan K. K.) as the lubricant (F), and 0.1 parts by mass of an ultraviolet absorber (Tinuvin 400 manufactured by Ciba Specialty Chemicals Inc.) and 0.1 parts by mass of a hindered amine-based light stabilizer (Tinuvin 292 manufactured by Ciba Specialty Chemicals Inc.) as the component (G).

(Production of Nano Concave-Convex Structural Body)

Several droplets of the obtained resin composition were dripped onto the surface of the stamper in which the pores had been formed, and an acrylic film having a thickness of 100 μm (HBS 010 manufactured by Mitsubishi Rayon Co., Ltd.) was used to cover the stamper while being pressed against the stamper. Subsequently, using a high-pressure mercury lamp, ultraviolet rays were irradiated onto the stamper from the side of the film with an energy of 1200 mJ/cm² to cure the resin composition. The film and the stamper were then peeled apart to obtain a film-like nano concave-convex structural body.

Measurement of the concave and convex portions of the thus obtained nano concave-convex structural body using the method described below revealed that a nano concave-convex structure with a substantially conical shape having a spacing between adjacent convex portions or concave portions of 100 nm and a convex portion height of 180 nm had been formed on the surface.

Measurement of Concave and Convex Portions of Nano Concave-Convex Structural Body:

A longitudinal cross-section of the nano concave-convex structural body was subjected to Pt vapor deposition (platinum vapor deposition) for 10 minutes, and the spacing between adjacent convex portions or concave portions and the convex portion height were measured using the same device and the same conditions as those described for the stamper. Specifically, each measurement was made at 10 points, and the respective average values were recorded as the measured values.

(Evaluations)

The obtained nano concave-convex structural body was subjected to the evaluations described below in (1) to (7). For evaluation, a pressure-sensitive adhesive (RA-600 manufactured by Sumiron Co., Ltd.) was used to affix the acrylic film side of the nano concave-convex structural body to an acrylic sheet (Acrylite L manufactured by Mitsubishi Rayon Co., Ltd., thickness: 2.0 mm), and the resulting structure was used as the test sample. The results are illustrated in Table 1.

Here, the test sample surface on which the nano concave-convex structure is formed is termed the "front surface", and the test sample surface on which the nano concave-convex structure is not formed is termed the "back surface".

(1) Measurement of Reflectance

From the front surface of the test sample, the relative reflectance across the wavelength region from 380 nm to 780 nm was measured at an incident angle of 5° using a spectrophotometer (U-4100 manufactured by Hitachi, Ltd.), and the reflectance at 550 nm, which represents the luminous reflectance, was determined and evaluated against the following evaluation criteria.

A: reflectance of 4.5% or less
C: reflectance exceeds 4.5%

(2) Evaluation of Adhesion

A cross-cut peeling test prescribed in JIS K5600-5-6 was performed on the front surface of the test sample, and the adhesion was evaluated against the following evaluation criteria.

A: peeled portion of less than 5%
B: peeled portion of at least 5% but less than 35%
C: peeled portion of at least 35%

(3) Evaluation of Scratch Resistance (Steel Wool Scratch Test)

Using a wear tester (Type 30S, manufactured by HEIDON), a 2 cm square steel wool (#0000) was pressed against the front surface of the test sample with a loading of 50 g, and the test sample was scratched under conditions including a back and forth movement distance of 30 mm, a head speed of 30 mm/s, and a total of 10 back and forth movements. Subsequently, the test sample was placed on a piece of black paper with the back surface contacting the paper, and the external appearance was inspected visually from the front surface of the test sample and evaluated against the following evaluation criteria.

A: 0 to 10 scratches are detected
B: 11 to 20 scratches are detected
C: countless (at least 21) scratches are detected (4) Evaluation of Soiling Resistance Following adhesion of a pseudo fingerprint liquid to the front surface of the test sample in accordance with a method disclosed in Japanese Unexamined Patent Application, First Publication No. 2006-147149 cited as the aforementioned Patent Document 1 (the pseudo fingerprint component 1 was prepared and used), a flannel cloth wet with water was fitted to a 20 mm square indenter, and a back and forth wear tester (HEIDON Type 30S, manufactured by Shinto Scientific Co., Ltd.) was used to wipe the surface of the test sample under conditions including a loading of 100 g, a stroke of 40 mm and 10 back and forth movements. Subsequently, the test sample was placed on a piece of black paper with the back surface contacting the paper, and the external appearance was inspected visually from the front surface of the test sample and evaluated against the following evaluation criteria.

A: No soiling can be detected visually
B: slight fingerprint soiling is detected visually
C: the fingerprint has simply been spread, with almost no removal by wiping (5) Evaluation of Water Resistance A cleaning cloth (Toraysee, manufactured by Toray Industries, Inc.) was thoroughly soaked with tap water and squeezed until no further water droplets dripped from the cloth, and the external appearance of the test sample when wiped with this cloth was inspected visually and evaluated against the following evaluation criteria.

A: favorable anti-reflective performance is maintained
B: slight white haze occurs
C: distinct cloudiness occurs (6) Determination of Water Contact Angle The water contact angle of the front surface of the test sample was measured using a contact angle measurement device (DM-501, manufactured by Kyowa Interface Science Co., Ltd.), and was then evaluated against the following evaluation criteria.

A: water contact angle of less than 25°
B: water contact angle of at least 25° but less than 35°
C: water contact angle of at least 35°

(7) Weather Resistance Test

Using a Sunshine Weather Meter (manufactured by Suga Test Instruments Co., Ltd.), a weather resistance test was performed on the test sample under conditions including a black panel temperature of 83° C., an internal humidity of 50% and no rainfall. After 300 hours had elapsed, the above evaluations (1) to (6) were performed.

Examples 2 to 6, Comparative Examples 1 to 10

With the exception of mixing the various components in accordance with the blend formulations shown in Table 1 or 2, resin compositions were prepared, and nano concave-convex structural bodies were produced and evaluated in the same manner as Example 1. The results are shown in Tables 1 or 2.

The nano concave-convex structure of the stamper was transferred to the front surface of the nano concave-convex structural body obtained in each of the examples and comparative examples, and in each case, a substantially conically shaped nano concave-convex structure having a spacing between adjacent convex portions or concave portions of 100 nm and a convex portion height of 180 nm was formed.

TABLE 1

| | | | | Example | | | | | |
|---|---|---|---|---|---|---|---|---|---|
| | | | | 1 | 2 | 3 | 4 | 5 | 6 |
| Resin composition formulation [parts by mass] | Polymerization reactive monomer component | Monomer (A) | A-TMMT | 0 | 60 | 0 | 0 | 0 | 65 |
| | | | TAS | 0 | 0 | 70 | 70 | 82 | 0 |
| | | | ATM-4E | 80 | 0 | 0 | 0 | 0 | 0 |
| | | Monomer (B) | A-400 | 0 | 30 | 0 | 0 | 0 | 25 |
| | | | A-600 | 20 | 0 | 0 | 0 | 0 | 0 |
| | | | M260 | 0 | 0 | 20 | 20 | 6 | 0 |
| | | Monomer (C) | HEA | 0 | 3 | 3 | 3 | 4 | 5 |
| | | | MMA | 0 | 7 | 0 | 0 | 0 | 5 |
| | | | MA | 0 | 0 | 7 | 7 | 8 | 0 |
| | Polymerization initiator (D) | | Irg. 184 | 0.5 | 0.5 | 1.0 | 1.0 | 1.0 | 1.0 |
| | | | Irg. 819 | 0 | 0 | 0.1 | 0.1 | 0.1 | 0.1 |
| | | | Dar. TPO | 0.5 | 0.5 | 0 | 0 | 0 | 0 |

TABLE 1-continued

|  |  |  |  | Example | | | | | |
|---|---|---|---|---|---|---|---|---|---|
|  |  |  |  | 1 | 2 | 3 | 4 | 5 | 6 |
|  | Release agent (E) |  | INT1856 | 0 | 0.1 | 0.3 | 0.5 | 0.3 | 0 |
|  |  |  | TLP4 | 0.1 | 0 | 0 | 0 | 0 | 1.0 |
|  | Lubricant (F) |  | BYK378 | 0.5 | 0 | 0 | 0 | 0 | 0 |
|  |  |  | BYK333 | 0 | 0 | 1.0 | 0.5 | 1.0 | 0 |
|  |  |  | BYK3500 | 0 | 0.5 | 0 | 0 | 0 | 1.0 |
|  | Component (G) | Ultraviolet absorber | TV400 | 0.1 | 0.05 | 0 | 0 | 0 | 1.0 |
|  |  |  | TV479 | 0 | 0.05 | 0 | 0 | 0 | 1.0 |
|  |  |  | Viosorb110 | 0 | 0 | 0.2 | 0.5 | 0.1 | 1.0 |
|  |  | Light stabilizer | TV292 | 0.1 | 0.05 | 0 | 0 | 0 | 1.0 |
| Evaluations | Initial | Reflectance |  | A | A | A | A | A | A |
|  |  | Adhesion |  | A | A | A | A | A | A |
|  |  | Scratch resistance |  | A | A | A | A | A | B |
|  |  | Soiling resistance |  | A | A | A | A | B | B |
|  |  | Water resistance |  | A | A | A | A | A | A |
|  |  | Water contact angle |  | A | A | A | A | A | A |
|  | After weather resistance test | Reflectance |  | A | A | A | A | A | A |
|  |  | Adhesion |  | A | A | A | A | A | A |
|  |  | Scratch resistance |  | A | A | A | A | A | B |
|  |  | Soiling resistance |  | A | A | A | A | B | B |
|  |  | Water resistance |  | A | A | A | A | A | A |
|  |  | Water contact angle |  | A | A | A | A | A | A |

TABLE 2

|  |  |  |  | Comparative Example | | | | | | | | | |
|---|---|---|---|---|---|---|---|---|---|---|---|---|---|
|  |  |  |  | 1 | 2 | 3 | 4 | 5 | 6 | 7 | 8 | 9 | 10 |
| Resin composition formulation [parts by mass] | Polymerization reactive monomer component | Monomer (A) | A-TMMT | 0 | 0 | 0 | 0 | 65 | 0 | 0 | 0 | 75 | 0 |
|  |  |  | TAS | 100 | 0 | 0 | 0 | 0 | 0 | 65 | 65 | 0 | 0 |
|  |  |  | ATM-4E | 0 | 75 | 60 | 60 | 0 | 68.5 | 0 | 0 | 0 | 0 |
|  |  | Monomer (B) | A-400 | 0 | 0 | 0 | 10 | 25 | 0 | 0 | 0 | 25 | 0 |
|  |  |  | A-600 | 0 | 0 | 40 | 0 | 0 | 28.5 | 0 | 0 | 0 | 0 |
|  |  |  | M260 | 0 | 0 | 0 | 0 | 0 | 0 | 25 | 25 | 0 | 40 |
|  |  | Monomer (C) | HEA | 0 | 0 | 0 | 30 | 10 | 0 | 7 | 7 | 0 | 10 |
|  |  |  | MA | 0 | 0 | 0 | 0 | 0 | 3 | 3 | 3 | 0 | 0 |
|  |  | Other monomers | DPHA | 0 | 0 | 0 | 0 | 0 | 0 | 0 | 0 | 0 | 50 |
|  |  |  | C6DA | 0 | 25 | 0 | 0 | 0 | 0 | 0 | 0 | 0 | 0 |
|  | Polymerization initiator (D) |  | Irg. 184 | 0 | 0 | 0 | 0 | 1.0 | 0 | 1.0 | 1.0 | 1.0 | 1.5 |
|  |  |  | Irg. 819 | 0 | 0 | 0 | 0 | 0.1 | 0 | 0.1 | 0.1 | 0.1 | 0 |
|  |  |  | Dar. 1173 | 0.5 | 0.5 | 0.5 | 0.5 | 0 | 0.5 | 0 | 0 | 0 | 0 |
|  |  |  | Dar. TPO | 0.5 | 0.5 | 0.5 | 0.5 | 0 | 0.5 | 0 | 0 | 0 | 0 |
|  | Release agent (E) |  | INT1856 | 0.3 | 0.3 | 0.3 | 0.3 | 0 | 0.3 | 0.1 | 5.0 | 0 | 0 |
|  | Lubricant (F) |  | BYK378 | 0 | 0 | 0 | 0 | 0 | 0 | 0 | 0 | 1.0 | 0 |
|  |  |  | BYK333 | 0 | 0 | 0 | 0 | 0 | 0 | 5.0 | 0 | 0 | 0 |
|  | Component (G) | Ultraviolet absorber | TV479 | 0 | 0 | 0 | 0 | 6.0 | 0 | 0 | 0 | 0.5 | 0 |
|  |  | Light stabilizer | TV292 | 0 | 0 | 0 | 0 | 0 | 0 | 0 | 0 | 0.5 | 0 |
| Evaluations | Initial | Reflectance |  | A | A | A | A | A | A | A | A | A | A |
|  |  | Adhesion |  | B | A | C | A | B | B | C | B | A | C |
|  |  | Scratch resistance |  | C | C | C | C | C | C | A | C | A | A |
|  |  | Soiling resistance |  | C | C | A | A | C | A | B | A | A | A |
|  |  | Water resistance |  | B | B | C | C | B | A | A | A | A | A |
|  |  | Water contact angle |  | C | C | A | A | C | A | A | A | A | A |
|  | After weather resistance test | Reflectance |  | — | — | — | — | A | A | A | C | A | — |
|  |  | Adhesion |  | — | — | — | — | B | B | C | B | A | — |
|  |  | Scratch resistance |  | — | — | — | — | C | C | B | C | A | — |
|  |  | Soiling resistance |  | — | — | — | — | C | A | C | A | C | — |
|  |  | Water resistance |  | — | — | — | — | B | A | A | A | A | — |
|  |  | Water contact angle |  | — | — | — | — | C | A | C | A | C | — |

The symbols and the like in Tables 1 and 2 refer to the following.

Monomer (A): the tetrafunctional (meth)acrylate monomer (A)

Monomer (B): the difunctional (meth)acrylate monomer (B)

Monomer (C): the monofunctional (meth)acrylate monomer (C)

Polymerization initiator (D): the active energy ray polymerization initiator (D)

Component (G): the ultraviolet absorber and/or light stabilizer (G)

A-TMMT: pentaerythritol tetraacrylate (NK Ester A-TMMT, manufactured by Shin-Nakamura Chemical Co., Ltd.)

TAS: condensation product of trimethylolethane, acrylic acid and succinic anhydride (TAS, manufactured by Osaka Organic Chemical Industry Ltd.)

ATM-4E: ethoxylated pentaerythritol tetraacrylate (NK Ester ATM-4E, manufactured by Shin-Nakamura Chemical Co., Ltd.)

A-400: polyethylene glycol diacrylate (NK Ester A-400, manufactured by Shin-Nakamura Chemical Co., Ltd.)

A-600: polyethylene glycol diacrylate (NK Ester A-600, manufactured by Shin-Nakamura Chemical Co., Ltd.)

M260: polyethylene glycol diacrylate (Aronix M260, manufactured by Toagosei Co., Ltd.)

HEA: hydroxyethyl acrylate

MMA: methyl methacrylate

MA: methyl acrylate

DPHA: dipentaerythritol hexaacrylate

C6DA: 1,6-hexanediol diacrylate

Irg. 184: 1-hydroxy-cyclohexyl-phenyl ketone (Irgacure 184, manufactured by Ciba Specialty Chemicals Inc.)

Irg. 819: bis(2,4,6-trimethylbenzoyl)-phenylphosphine oxide (Irgacure 819, manufactured by Ciba Specialty Chemicals Inc.)

Dar. 1173: 2-hydroxy-2-methyl-1-phenylpropan-1-one (Darocure 1173, manufactured by Ciba Specialty Chemicals Inc.)

Dar. TPO: 2,4,6-trimethylbenzoyl-diphenylphosphine oxide (Darocure TPO, manufactured by Ciba Specialty Chemicals Inc.)

INT1856: a polyoxyethylene alkyl phosphate ester compound (Moldwiz INT-1856, manufactured by Axel Plastics Research Laboratories, Inc.)

TLP4: a polyoxyethylene alkyl phosphate ester compound (Nikkol TLP-4, manufactured by Nikko Chemicals Co., Ltd.)

BYK378: a lubricant (BYK-378, manufactured by Byk-Chemie Japan K.K.)

BYK333: a lubricant (BYK-333, manufactured by Byk-Chemie Japan K.K.)

BYK3500: a lubricant (BYK-3500, manufactured by Byk-Chemie Japan K.K.)

TV400: an ultraviolet absorber (Tinuvin 400, manufactured by Ciba Specialty Chemicals Inc.)

TV479: an ultraviolet absorber (Tinuvin 479, manufactured by Ciba Specialty Chemicals Inc.)

Viosorb110: an ultraviolet absorber (Viosorb 110, manufactured by Kyodo Chemical Co., Ltd.)

TV292: a hindered amine-based light stabilizer (Tinuvin 292, manufactured by Ciba Specialty Chemicals Inc.)

As is clear from the results in Table 1, the nano concave-convex structural bodies obtained in Examples 1 to 6 had favorable adhesion, scratch resistance, soiling resistance and water resistance and low reflectance, and similar results were obtained after the weather resistance test.

In the case of Example 1, although the polymerization reactive monomer component does not contain the monomer (C), it contains a good balance of the monomer (A) and the monomer (B), and also contains prescribed amounts of the polymerization initiator (D), the release agent (E) and the lubricant (F), and therefore exhibited good adhesion.

In contrast, in the nano concave-convex structural body obtained in Comparative Example 1, because the polymerization reactive monomer component is composed only of the monomer (A), the water contact angle increased, and soiling resistance was not achieved. Further, because the resin composition does not contain the lubricant (F), favorable scratch resistance could not be obtained.

In the case of the nano concave-convex structural body obtained in Comparative Example 2, because the polymerization reactive monomer component in the resin composition does not contain the monomer (B), the water contact angle increased, and soiling resistance was not achieved. Further, because the resin composition does not contain the lubricant (F), favorable scratch resistance could not be obtained.

In the case of the nano concave-convex structural body obtained in Comparative Example 3, the amount of the monomer (B) within the polymerization reactive monomer component is very large, and therefore although good soiling resistance was realized, the water resistance was poor, and the optical performance deteriorated upon wiping with a damp cloth. Further, because the polymerization reactive monomer component does not contain the monomer (C), the adhesion was also poor. Moreover, because the resin composition does not contain the lubricant (F), favorable scratch resistance could not be obtained.

In the case of the nano concave-convex structural body obtained in Comparative Example 4, because the amount of the monomer (C) within the polymerization reactive monomer component is very large, and the resin composition does not contain the lubricant (F), favorable scratch resistance could not be obtained. Further, the water resistance was poor, and the optical performance deteriorated upon wiping with a damp cloth.

In the case of the nano concave-convex structural body obtained in Comparative Example 5, because the resin composition does not contain the lubricant (F), favorable scratch resistance could not be obtained. Further, the resin composition does not contain the release agent (E), and the amount of the ultraviolet absorber is also comparatively large, and therefore the water contact angle increased, and soiling resistance could not be achieved, either initially or following the weather resistance test.

In the nano concave-convex structural body obtained in Comparative Example 6, because the resin composition does not contain the lubricant (F), scratch resistance could not be obtained.

In the nano concave-convex structural body obtained in Comparative Example 7, because the amount of the lubricant (F) in the resin composition is large, the initial adhesion deteriorated, and upon weather resistance testing, the water contact angle increased and soiling resistance was lost.

In the nano concave-convex structural body obtained in Comparative Example 8, because the amount of the release agent (E) in the resin composition is large, mottling occurred on the surface resulting in an unsatisfactory external appearance, and the reflectance also increased after the weather resistance test. Furthermore, because the resin composition does not contain the lubricant (F), favorable scratch resistance could not be obtained.

The nano concave-convex structural body obtained in Comparative Example 9 had good initial performance, but because the resin composition does not contain the release agent (E), upon weather resistance testing, the water contact angle increased and the soiling resistance deteriorated.

In the case of the concave-convex structural body obtained in Comparative Example 10, although the polymerization reactive monomer component does not contain the monomer (A) and the resin composition does not contain the lubricant (F), because the polymerization reactive monomer component contained the hexafunctional monomer DPHA (dipentaerythritol hexaacrylate), similar scratch resistance to that of the examples was obtained. In addition, although the amount of the monomer (B) in the polymerization reactive monomer component is large, water resistance was also obtained. However, DPHA exhibits poor adhesion to the substrate, and despite including the monomer (C) which acts as an adhesion improving component, the obtained nano concave-convex structural body exhibited poor initial adhesion to the substrate film, and was unsuitable for use as a commercial product.

Comparative Examples 1 to 4 and 10 did not exhibit favorable performance in the initial evaluations and lacked practical applicability, and were therefore not subjected to the weather resistance test.

INDUSTRIAL APPLICABILITY

A nano concave-convex structural body obtained by curing the resin composition for a nano concave-convex structure according to the present invention combines favorable fingerprint wipeability with a high level of scratch resistance, and also exhibits excellent weather resistance, while maintaining the superior optical performance of a nano concave-convex structural body. Accordingly, the nano concave-convex structural body can be used in optical applications, including various display panels that may be used outdoors, lenses, show windows, vehicle meter covers, vehicle navigation systems, spectacle lenses, and members for improving the light extraction efficiency of solar cells, and is extremely useful industrially. Further, the nano concave-convex structural body can also be used on mirrors or window materials or the like, which suffer a deterioration in visibility upon adhesion of water droplets.

DESCRIPTION OF THE REFERENCE SIGNS

10: Nano concave-convex structural body
11: Transparent substrate
12: Cured product layer
13: Convex portion
13a: Peak of convex portion
14: Concave portion
14a: Bottom of concave portion
w1: Spacing between adjacent convex portions
d1: Vertical distance from bottom of concave portion to peak of convex portion

The invention claimed is:

1. A transparent cover of a vehicle meter comprising a nano concave-convex structure body having a transparent substrate and a cured product layer laminated on top of the transparent substrate, wherein the cured product layer has a nano concave-convex structure on the surface of the cured product layer and contains a cured product of a resin composition,
wherein the water contact angle of the nano concave-convex structure on the surface of the cured product layer after weather resistance testing is less than 25°,
wherein the resin composition comprising a polymerization reactive monomer component which, when a total amount of all monomers within the polymerization reactive monomer component is deemed to be 100 parts by mass, comprises:
50 to 95 parts by mass of a tetrafunctional (meth)acrylate monomer (A) having 4 radical polymerizable functional groups per molecule,
5 to 35 parts by mass of a difunctional (meth)acrylate monomer (B) having 2 radical polymerizable functional groups and a polyalkylene glycol structure per molecule, in which a total number of repeating units of the alkylene glycol structure that exist in a single molecule is from 4 to 25, and
not more than 15 parts by mass of a monofunctional (meth)acrylate monomer (C) which is copolymerizable with the tetrafunctional (meth)acrylate monomer (A) and the difunctional (meth)acrylate monomer (B), and has one radical polymerizable functional group per molecule,
and further comprising, per 100 parts by mass of the polymerization reactive monomer component, 0.01 to 10 parts by mass of an active energy ray polymerization initiator (D), 0.01 to 3 parts by mass of a release agent (E), and 0.01 to 3 parts by mass of a of a lubricant (F),
wherein the release agent (E) is at least one polyoxyethylene alkyl phosphate ester compound represented by general formula (I) shown below:

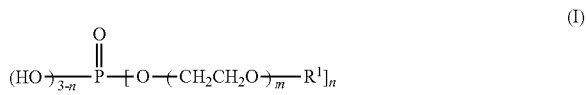

(I)

wherein $R^1$ represents an alkyl group, m represents an integer of 1 to 20, and n represents an integer of 1 to 3.

2. The transparent cover of a vehicle meter according to claim 1, further comprising 0.01 to 5 parts by mass of at least one component (G) selected from the group consisting of ultraviolet absorbers and light stabilizers, per 100 parts by mass of the polymerization reactive monomer component.

3. The transparent cover of a vehicle meter according to claim 1, wherein the tetrafunctional (meth)acrylate monomer (A) is at least one compound selected from the group consisting of pentaerythritol tetra(meth)acrylate, ethoxy modified products of pentaerythritol tetra(meth)acrylate, ditrimethylolpropane tetra(meth)acrylate, ethoxy modified products of ditrimethylolpropane tetra(meth)acrylate, and condensation reaction products of trimethylolethane, acrylic acid and succinic anhydride.

4. The transparent cover of a vehicle meter according to claim 1, wherein the polyalkylene glycol structure of the difunctional (meth)acrylate monomer (B) is a polyethylene glycol structure.

5. The transparent cover of a vehicle meter according to claim 1, wherein the lubricant (F) is a compound having a polyether-modified polydimethylsiloxane skeleton.

6. A transparent cover of a vehicle navigation device comprising a nano concave-convex structure body having a transparent substrate and a cured product layer laminated on top of the transparent substrate, wherein the cured product layer has a nano concave-convex structure on the surface of the cured product layer and contains a cured product of a resin composition,
wherein the water contact angle of the nano concave-convex structure on the surface of the cured product layer after weather resistance testing is less than 25°,
wherein the resin composition comprising a polymerization reactive monomer component which, when a total amount of all monomers within the polymerization reactive monomer component is deemed to be 100 parts by mass, comprises 50 to 95 parts by mass of a tetrafunctional (meth)acrylate monomer (A) having 4 radical polymerizable functional groups per molecule, 5 to 35 parts by mass of a difunctional (meth)acrylate monomer (B) having 2 radical polymerizable functional groups and a polyalkylene glycol structure per molecule, in which a total number of repeating units of the alkylene glycol structure that exist in a single molecule is from 4 to 25, and not more than 15 parts by mass of a monofunctional (meth)acrylate monomer (C) which is copolymerizable with the tetrafunctional (meth)acrylate monomer (A) and the difunctional (meth)acrylate monomer (B), and has one radical polymerizable functional group per molecule, and further comprising, per 100 parts by mass of the polymerization reactive monomer component, 0.01 to 10 parts by mass of an active energy ray polymerization initiator (D), 0.01 to 3 parts by mass of a release agent (E), and 0.01 to 3 parts by mass of a lubricant (F), wherein the release agent (E) is at least one polyoxyethylene alkyl phosphate ester compound represented by general formula (I) shown below:

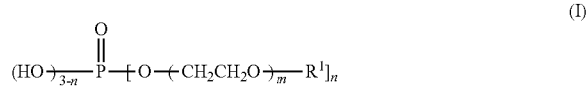

(I)

wherein $R^1$ represents an alkyl group, m represents an integer of 1 to 20, and n represents an integer of 1 to 3.

7. The transparent cover of a vehicle navigation device according to claim 6, further comprising 0.01 to 5 parts by mass of at least one component (G) selected from the group consisting of ultraviolet absorbers and light stabilizers, per 100 parts by mass of the polymerization reactive monomer component.

8. The transparent cover of a vehicle navigation device according to claim 6, wherein the tetrafunctional (meth)acrylate monomer (A) is at least one compound selected from the group consisting of pentaerythritol tetra(meth)acrylate, ethoxy modified products of pentaerythritol tetra(meth)acrylate, ditrimethylolpropane tetra(meth)acrylate, ethoxy modified products of ditrimethylolpropane tetra(meth)acrylate, and condensation reaction products of trimethylolethane, acrylic acid and succinic anhydride.

9. The transparent cover of a vehicle navigation device according to claim 6, wherein the polyalkylene glycol structure of the difunctional (meth)acrylate monomer (B) is a polyethylene glycol structure.

10. The transparent cover of a vehicle navigation device according to claim 6, wherein the lubricant (F) is a compound having a polyether-modified polydimethylsiloxane skeleton.

* * * * *

UNITED STATES PATENT AND TRADEMARK OFFICE
CERTIFICATE OF CORRECTION

PATENT NO.        : 9,284,445 B2
APPLICATION NO.   : 14/123801
DATED             : March 15, 2016
INVENTOR(S)       : Masayuki Uchida et al.

It is certified that error appears in the above-identified patent and that said Letters Patent is hereby corrected as shown below:

Title Page, Item (73) Assignee:

Please replace "Mitsubishi Motor Co., Ltd., Tokyo (JP); Nissan Motor Co., Ltd., Kanagawa (JP)" with -- Mitsubishi Rayon Co., Ltd., Tokyo (JP); Nissan Motor Co., Ltd., Kanagawa (JP) --

Signed and Sealed this
Sixteenth Day of August, 2016

Michelle K. Lee
*Director of the United States Patent and Trademark Office*